US 8,183,663 B2

(12) United States Patent
Kim et al.

(10) Patent No.: US 8,183,663 B2
(45) Date of Patent: May 22, 2012

(54) CRACK RESISTANT CIRCUIT UNDER PAD STRUCTURE AND METHOD OF MANUFACTURING THE SAME

(75) Inventors: Kyounghwan Kim, Hwaseong-si (KR); Hongkook Min, Yongin-si (KR); Sungkyoo Park, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/985,567

(22) Filed: Jan. 6, 2011

(65) Prior Publication Data

US 2011/0101487 A1    May 5, 2011

Related U.S. Application Data

(63) Continuation-in-part of application No. 12/608,018, filed on Oct. 29, 2009, now Pat. No. 7,888,802.

(51) Int. Cl.
*H01L 23/48* (2006.01)

(52) U.S. Cl. .................. 257/503; 257/758; 257/E23.01

(58) Field of Classification Search .................. 257/503, 257/E23.01, E21.476, 758; 438/675
See application file for complete search history.

(56) References Cited

U.S. PATENT DOCUMENTS

| 5,594,279 A * | 1/1997 | Itou et al. ............ 257/758 |
| 7,291,918 B2 * | 11/2007 | Tsai et al. ............ 257/758 |
| 7,498,638 B2 * | 3/2009 | Suzuki ............ 257/355 |

FOREIGN PATENT DOCUMENTS

| JP | 2005-327913 A | 11/2005 |
| JP | 2007-180363 A | 7/2007 |
| KR | 1020060106105 A | 10/2006 |

* cited by examiner

*Primary Examiner* — Roy Potter
(74) *Attorney, Agent, or Firm* — Volentine & Whitt, PLLC

(57) ABSTRACT

A circuit under pad structure includes a substrate, a pad electrode, wiring layers interlayer insulation layers alternately disposed between the pad electrode and the substrate, and at least one circuit pattern integral with the substrate, disposed beneath the lowermost wiring layer and spanned by the pad electrode. The width of each wiring layer is smaller than the width of the wiring layer beneath it, i.e., closer to the substrate. The structure is fabricated such that it resists cracking, which maximizes its production yield, and possesses a minimal footprint.

19 Claims, 14 Drawing Sheets

CRACK RESISTANT CIRCUIT UNDER PAD STRUCTURE AND METHOD OF MANUFACTURING THE SAME

CROSS-REFERENCE TO RELATED APPLICATIONS

This application is a Continuation-in-Part of U.S. application Ser. No. 12/608,018, filed Oct. 29, 2009, and which claims priority under 35 U.S.C. §119 from Korean Patent Application 10-2008-0129274, filed on Dec. 18, 2008.

BACKGROUND

The inventive concept relates to a device, such as a semiconductor device, having a bonding pad and to a method of manufacturing a device having a bonding pad. More particularly, the inventive concept relates to a CUP (circuit under pad) structure of a semiconductor device or the like and to a method of manufacturing the same.

An integrated circuit of a semiconductor device is often electrically connected to an external device, circuitry, etc. by a wire. To this end, the wire is bonded to a bonding pad of the semiconductor device. The process of bonding the wire to the bonding pad mainly entails exerting a mechanical compressive force on the wire. This force is applied to the wire, and hence to the bonding pad, by a mechanical bonding apparatus. In general, the bonding pad includes a substrate, an upper wiring layer to which the wire is bonded, an interlayer insulation layer interposed between the upper wiring layer and the substrate, and at least one lower wiring layer embedded in the interlayer insulation layer.

The layout of the lower wiring layer(s) has been influenced by recent demands for smaller and smaller semiconductor devices. In particular, the interlayer insulation layer and the lower wiring layer(s) are becoming thinner as semiconductor devices are being scaled down. As a result, stress from the outside of the device has a relatively high chance of causing the bonding pad to crack. Specifically, the interlayer insulation layer tends to crack just below the upper wiring layer when the compressive force generated during a wire bonding process is applied to the bonding pad. This is especially prevalent in the case in which the interlayer insulation layer is mainly formed of silicon oxide. Silicon oxide does not adhere well to metal and thus, the interlayer insulation layer of the bonding pad is likely to crack at its boundary with the upper wiring layer. In this case, the upper wiring layer can peel off of the interlayer insulation layer, i.e., a so-called peel-off defect occurs.

SUMMARY

According to one aspect of the inventive concept there is provided circuit under pad structure including a substrate, interlayer insulation layers disposed on the substrate, a bonding pad of electrically conductive material disposed on the interlayer insulation layers, lower layers of wiring alternately disposed with the interlayer insulation layers between the pad electrode and the substrate, wherein the widths of the lower layers of wiring sequentially increase in a downward direction from the bonding pad towards the substrate, and at least one electronic circuit disposed beneath a lowermost one of the lower layers of wiring, and wherein the bonding pad spans each said at least one electronic circuit.

According to another aspect of the inventive concept, there is provided circuit under pad structure including a substrate, at least one circuit pattern integral with the substrate, a first interlayer insulation layer disposed on the substrate over the at least one circuit pattern, a first lower layer of wiring disposed on the first interlayer insulation layer and having a first opening therethrough, a second interlayer insulation layer disposed on the first lower layer of wiring and buried in the first opening, a second lower layer of wiring having a second opening therethrough and disposed on the second interlayer insulation layer, the second opening being wider than the first opening, a third interlayer insulation layer disposed on the second lower layer of wiring and buried in the second opening, and a pad electrode disposed on the third interlayer insulation layer and spanning the second opening.

According to still another aspect of the inventive concept there is provided a method of manufacturing circuit under pad structure, the method comprising: forming at least one circuit pattern integrally with a substrate, forming a first interlayer insulation layer on the substrate so as to cover the at least one circuit pattern, forming, on the first interlayer insulation layer, a first lower layer of wiring having therethrough a first opening that exposes the first interlayer insulation layer, forming a second interlayer insulation layer on the first lower layer of wiring so as to be buried in the first opening, forming a second lower layer of wiring, having therethrough a second opening wider than the first opening, on the second interlayer insulation layer, forming a third interlayer insulation layer on the second lower layer of wiring so as to be buried in the second opening, and forming a pad electrode on the third interlayer insulation layer as spanning the second opening.

BRIEF DESCRIPTION OF THE DRAWINGS

The inventive concept will become more fully understood from the detailed description of embodiments that follows made with reference to the accompanying drawings, wherein.

DETAILED DESCRIPTION OF THE PREFERRED EMBODIMENTS

Embodiments of the inventive concept now will be described more fully hereinafter with reference to the accompanying drawings. It will, however, be understood to those skilled in the art that the inventive concept may be embodied in forms other than those specifically described herein. Furthermore, it should be noted that the terms 'layer' and 'film' are used interchangeably in the description that follows.

Figure 1:
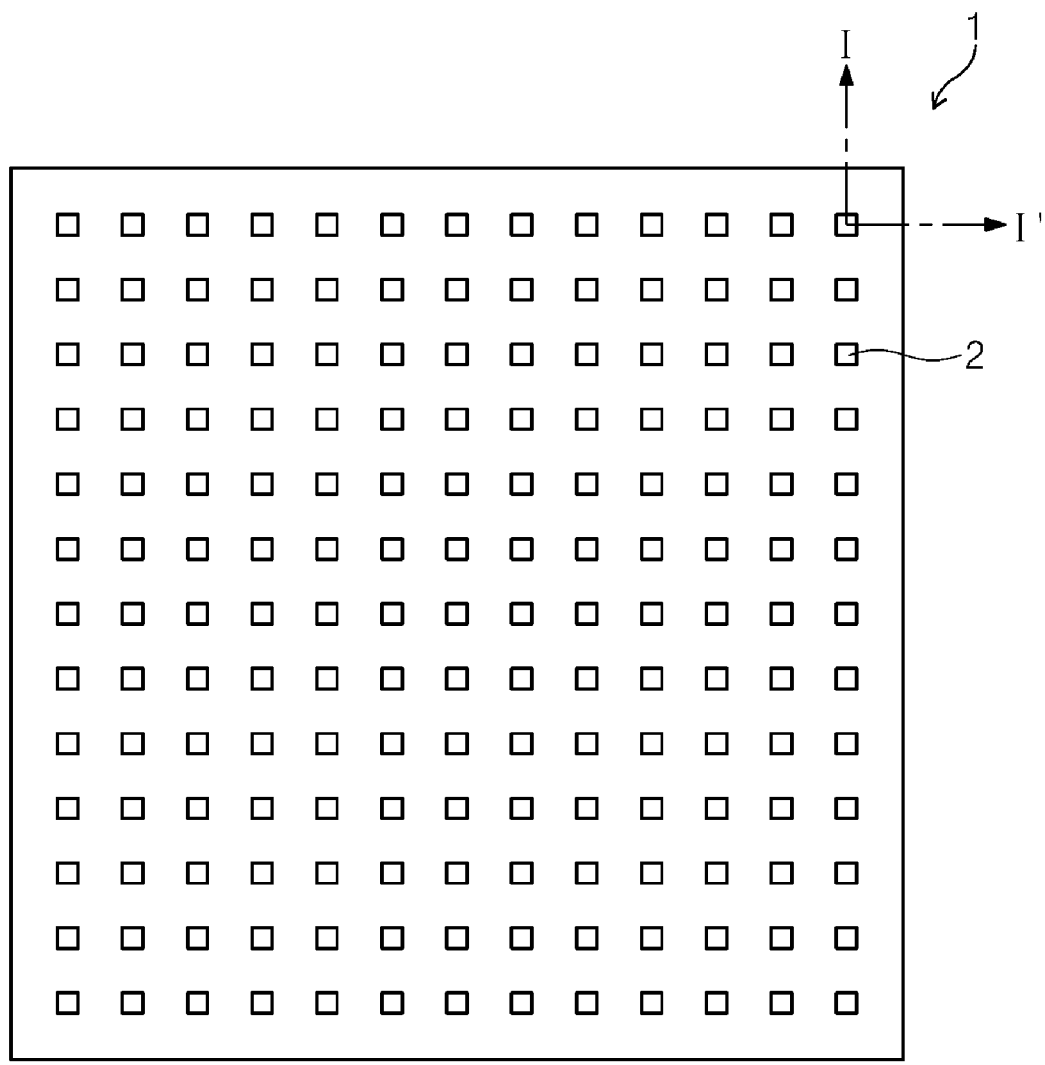
FIG. 1 is a plan view of a die having bonding pads according to the inventive concept.
Figure 2:
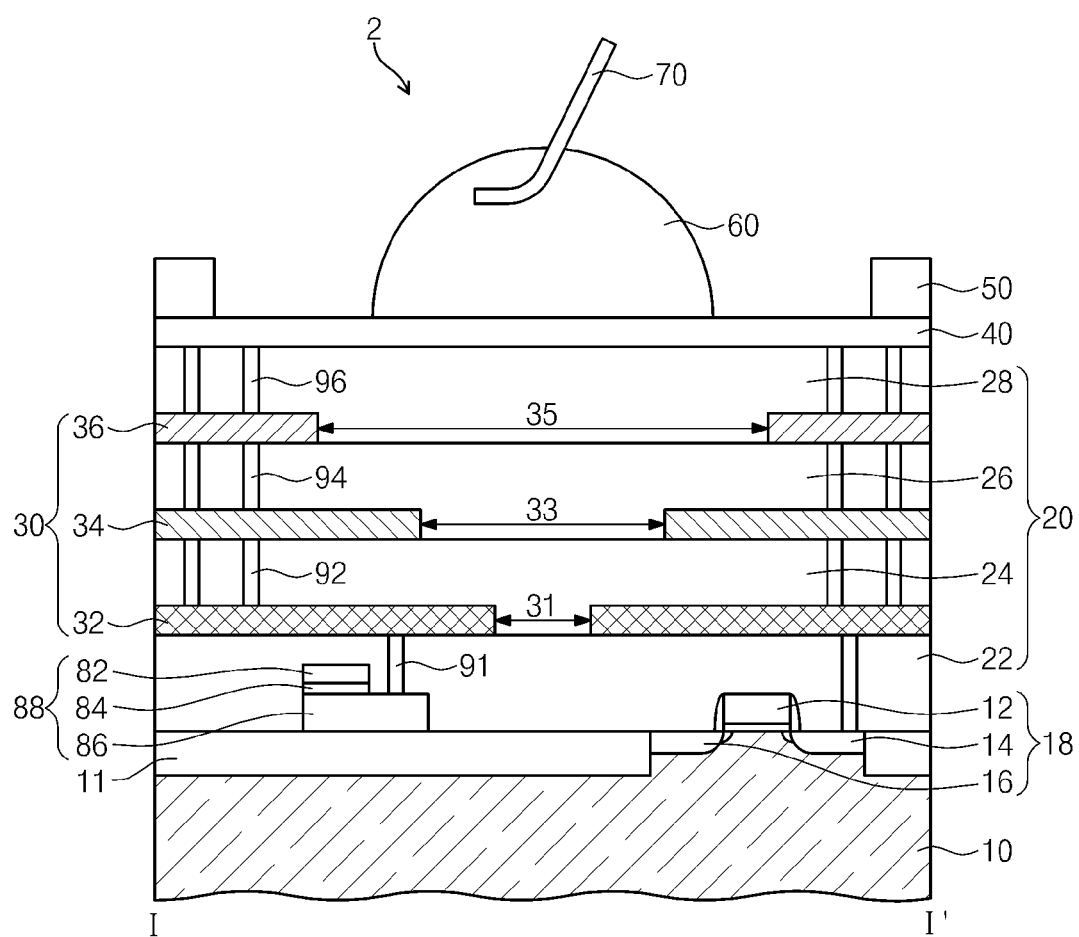
FIG. 2 is a cross-sectional view of a CUP (circuit under pad) structure of a semiconductor device according to the inventive concept, as would be seen in the direction of line I-I' of FIG. 1.

FIG. 1 shows a die 1 including an array of bonding pads 2 of a semiconductor device according to the inventive concept, and FIG. 2 shows a CUP (circuit under pad) structure, comprising a bonding pad 2, according to the inventive concept.

Referring to FIGS. 1 and 2, an example of the bonding pad 2 according to the inventive concept includes interlayer insulation 20 on a substrate 10, lower wiring layers 30 vertically spaced from one another (juxtaposed) throughout the interlayer insulation 20, and an upper wiring layer 40 on the interlayer insulation 20. The lower wiring layers 30 collectively have a stepped configuration characterized in that the respective areas thereof increase in the vertically downward direction (from the pad electrode 40 to the substrate 10), and each lower wiring layer 30 projects further inwardly (toward the center of the bonding pad 2) than the lower wiring layer above it.

This example of the bonding pad 2 also has a passivation layer 50. The upper wiring layer 40, which is the last metal layer on the surface of the die, is selectively exposed by the passivation layer 50 and thus constitutes a pad electrode (and thus, the upper wiring layer 40 will be referred to as a pad electrode hereinafter). More specifically, the passivation layer 50 has openings therethrough which expose the pad electrode 40 of each of the bonding pads 2 of the die, respectively. In this example, each opening is square. Furthermore, in this example, a respective rounded conductor in the form of a ball 60 is situated on the pad electrode 40 at the center of each opening in the passivation layer 50. A wire 70 is bonded to the bonding pad 2 via the ball 60.

In addition to the substrate 10 and bonding pads 2, the die 1 has at least one circuit pattern disposed under the pad electrodes 40 and wiring layers 30. The circuit pattern(s) may be disposed within the substrate 10 or between the substrate 10 and the interlayer insulation 20. The circuit pattern(s) comprise(s) a plurality of electronic components, examples of which will be described in more detail below. In the case in which the components are disposed on the substrate 10, they may be electrically isolated from each other by a device isolation layer 11. In any case, the electronic components of the circuit pattern(s) are vertically juxtaposed with and spanned by the pad electrodes 40. Thus, the footprints of the bonding pads 2 and hence, the size of a chip fabricated of the CUP structures, is minimal.

The circuit pattern(s) may include an electro-static discharge (ESD) circuit. In this example, the circuit pattern(s) control input/output signals through the plurality of wiring layers 30 and the pad electrodes 40. Thus, the electronic components of the circuit pattern(s) in this example of a CUP structure according to the inventive concept may be considered as input/output devices. Each input/output device may be a MOS transistor 18, a capacitor 88, a diode, or a resistor.

For example, an input/output device may be a MOS transistor 18 having source 14 and drain 16 in the substrate 10 (respective regions of the substrate doped with the same conductive impurity), and a gate electrode 12 disposed on the substrate 10 between the source 14 and the drain 16. The MOS transistor 18 may be an NMOS transistor or a PMOS transistor depending on the conductivity type of the impurity.

An input/output device may be a diode or resistor employing a structure similar to that of a MOS transistor and in which the electrode 12 is floated, i.e., is electrically isolated from the substrate. In the case of a resistor, regions corresponding to the source 14, the drain 16, and the substrate 10 between the source 14 and the drain 16, are all doped with the same conductive impurity. In the case of diode, regions corresponding to the source 14 and the drain 16 are disposed adjacent to each other and are doped with impurities having different conductivities.

In an example in which an input/output device is a capacitor, the capacitor 88 is disposed on device isolation layer 11 and includes a lower electrode 86, a dielectric layer 84, and an upper electrode 82. The lower electrode 86 and the upper electrode 82 may be of polysilicon or metal doped with a conductive impurity. The dielectric layer 82 may be of a high k dielectric. For example, the dielectric layer 84 may be of material selected from the group consisting of hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$), tantalum oxide ($TaO_2$), zirconium silicon oxide (ZrSiO), lanthanum oxide ($La_2O_3$), praseodymium oxide ($Pr_2O_3$), dysprosium oxide ($Dy_2O_3$), BST oxide ($Ba_xSr_{1-x}TiO_3$), or PZT oxide ($Pb(Zr_xTi_{1-x})O_3$).

Figure 3:
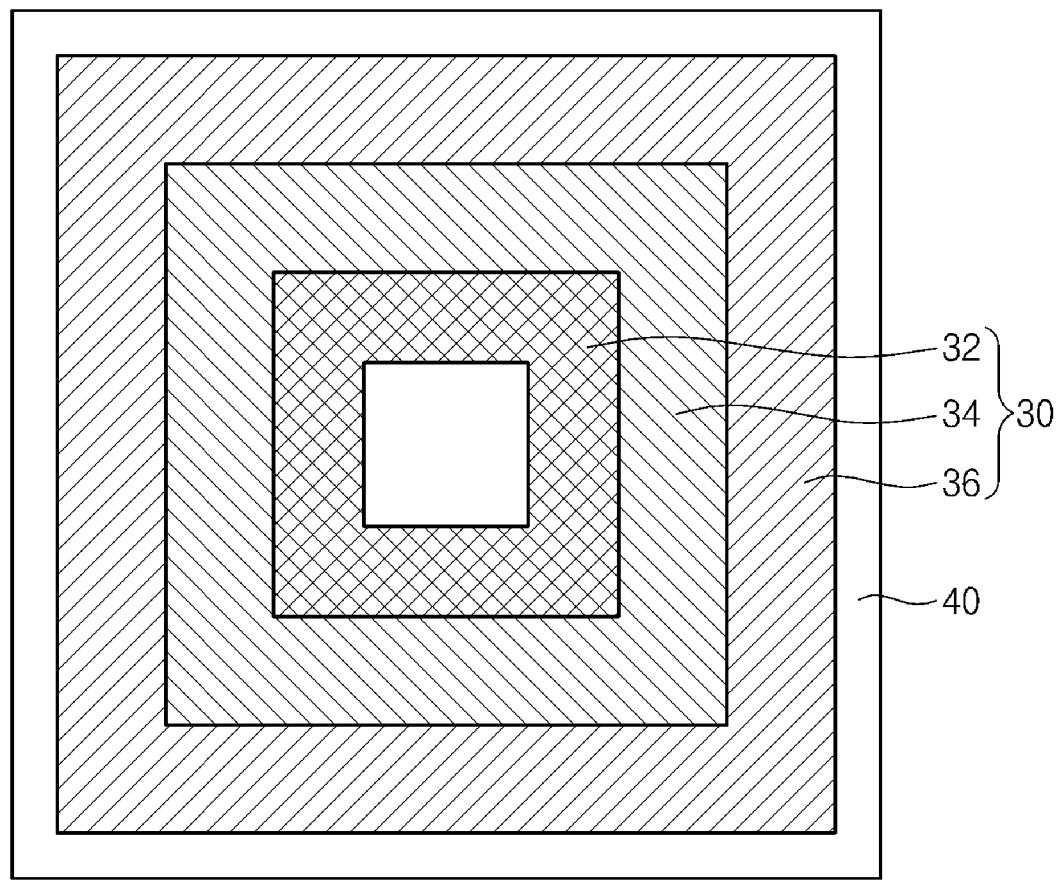
FIG. 3 is an enlarged plan view of a bonding pad of the die shown in FIG. 1.

Referring now to FIGS. 2 and 3, the interlayer insulation 20 may be of silicon oxide. In the example shown in FIG. 2, the interlayer insulation 20 includes a first interlayer insulation layer 22 interposed between the substrate 10 and the first wiring layer 32, a second interlayer insulation layer 24 interposed between the first wiring layer 32 and the second wiring layer 34, a third interlayer insulation layer 26 interposed between the second wiring layer 34 and the third wiring layer 36, and a fourth interlayer insulation layer 28 interposed between the third wiring layer 36 and the pad electrode 40. The interlayer insulation 20 electrically isolates the wiring layers 30, and each layer 22, 24, 26, 28 thereof is planarized so as to rid the upper surfaces of the layers that would otherwise be present as a result of the forming of insulation 20 over such wiring layers 30. Also, the interlayer insulation 20 has contact holes extending vertically therethrough, and contact plugs occupying the contacts holes are electrically conductively connected to the wiring layers 30 and to the circuit pattern(s).

The lower wiring layers 30 are interlayer metal layers, and may each have the form of a ring or loop. In the example shown in FIG. 2, the wiring layers 30 include a first lower wiring layer 32 having a first opening 31, a second lower wiring layer 34 having a second opening 33 larger than the first opening 31, and a third lower wiring layer 36 having a third opening 35 larger than the second opening 33. The fourth interlayer insulation layer 28 is disposed in the third opening 35. The third interlayer insulation layer 26 is disposed in the second opening 33. The second interlayer insulation layer 24 is disposed in the first opening 31 smaller than the second opening 33. However, the inventive concept is not so limited. For example, a fourth lower wiring layer having a fourth opening larger than the third opening part 35 may be provided in the interlayer insulation 20 above the third lower wiring layer 36 (in which case an interlayer insulation layer is interposed between the fourth lower wiring layer and the pad electrode 40).

Thus, the lower wiring layers 30 form steps that converge in the depth-wise direction of the interlayer insulation 20, i.e., in the downward direction toward the substrate 10. Characteristically, the outer edges of the ring or loop-shaped lower wiring layers 30 are vertically aligned with those of the upper wiring layer 40, and the surface areas of the lower wiring layers 30 gradually increase in the depth-wise direction of the interlayer insulation 20. Furthermore, the widths of the ring or loop-shaped lower wiring layers 30 gradually increase in the depth-wise direction. Therefore, the openings in the wiring layers 30 become sequentially smaller in a direction from the upper wiring layer 40 towards the substrate 10, the opening in the lower wiring layer 36 closest to the upper wiring layer 40 is relatively large, and a relatively large area of surface contact exists between the interlayer insulation 20 and the lower wiring layers 30. Due to such features, the lower wiring layers 30 prevent the interlayer insulation layer 20 from cracking due to stress applied to the pad electrode 40 when a ball 60 and a wire 70 is bonded to the bonding pad 2, as will be described in more detail below.

A sub contact plug 91 electrically connects (an electronic component of) the circuit pattern(s) to the first wiring layer 32. A first contact plug 92 extends through the second interlayer insulation layer 24 between the first lower wiring layer 32 and the second lower wiring layer 34 so as to electrically conductively connect the wiring layers 32 and 34. A second contact plug 94 extends through the third interlayer insulation layer 26 between the second and third lower wiring layers 34 and 36 so as to electrically conductively connect the wiring layers 34 and 36. A third contact plug 96 extends through the interlayer insulation layer 20 between the upper wiring layer 40 and the third lower wiring layer 36 so as to electrically conductively connect the third wiring layer 36 and the upper wiring layer 40. In the example of the CUP structure according to the inventive concept, the first to third contact plugs 92 to 96 all extend through the lower interlayer insulation layer 20 beneath an outer peripheral portion of the pad electrode 40 and more specifically, beneath the outer periphery of that part of the upper pad electrode 40 exposed by the passivation layer 50 and outwardly of the ball 60 by which the wire 70 is bonded to the upper wiring layer 40.

The pad electrode 40 is the metal layer exposed at the surface of the die 1 and, as mentioned above, is the layer to which the ball 60 and wire 70 are bonded. The pad electrode 40 may be square or have a quadrangular shape. The wire 70 and the ball 60 may be formed of the same metal. In examples of the bonding pad 2 of the CUP structure according to the inventive concept, the pad electrode 40 is formed of aluminum or an aluminum alloy, the wire 70 is formed of gold or a gold alloy, and the ball 60 coupling the upper wiring layer 40 and the wire 70 is formed of copper, silver, gold or an alloy of copper, silver or gold. Hence, the wire 70 is electrically conductively connected to the pad electrode 40. Although not shown in the drawing, a bonding apparatus presses the end of the wire 70 and the ball 60 together and thereby exerts a mechanical compressive force at the center of the pad electrode 40 to bond the wire 70 to the ball 60 and hence, to the bonding pad 2. In this respect, the ball 60 and the wire 70 may be simultaneously bonded to the pad electrode 40. Alternatively, the ball 60 and the wire 70 may be sequentially bonded to the pad electrode 40. The ball 60 may be bonded on the center of the pad electrode 40.

Figure 4A:
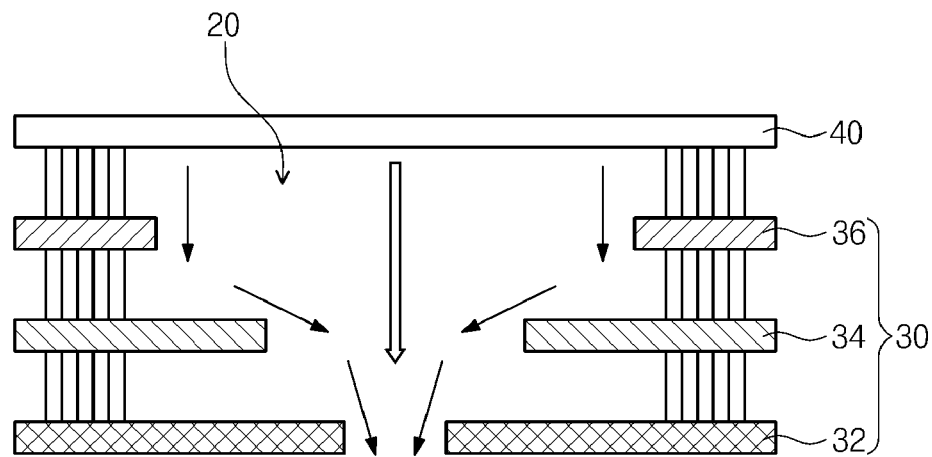
FIGS. 4A and 4B are schematic diagrams of bonding pads according to the inventive concept and the related art, respectively.
Figure 4B:
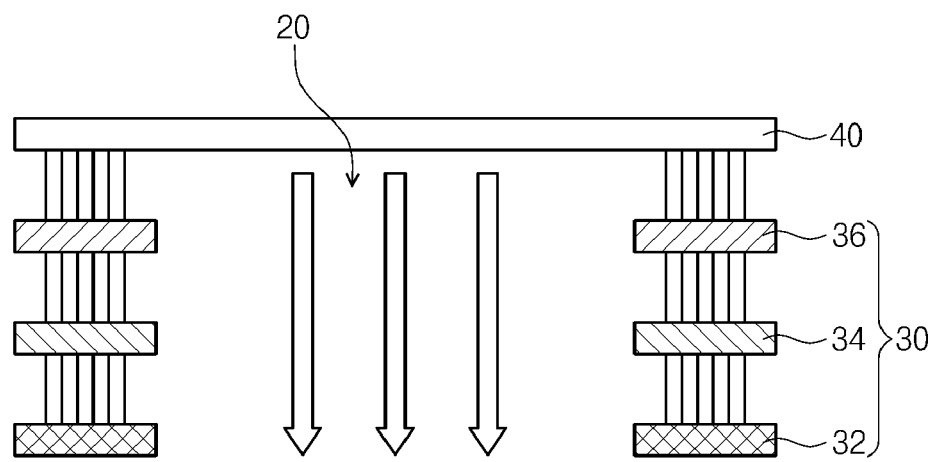

Hence, the interlayer insulation layers 22, 24, 26, 28 may be subject to a stress from the pad electrode 40 when the pad electrode 40 and the ball 60 are bonded to each other, or the ball 60 and the wire 70 are bonded to each other. A bonding pad 2 of the CUP structure according to the inventive concept alleviates such stress in a manner that will be described by comparing the structure according to the inventive concept as illustrated schematically in FIG. 4A with a bonding pad of the related art as illustrated schematically in FIG. 4B. In FIGS. 4A and 4B, the arrows represent the stress created in a vertical direction as the result of a compressive force exerted on the pad electrode 40.

Referring first to FIG. 4B, the bonding pad of the related art includes a pad electrode 40, wiring layers 30 having the same line widths under the pad electrode 40, and interlayer insulation 20 encapsulating the wiring layers 30. The interlayer insulation layer 20 is thus concentrated under the central portion of the pad electrode 40, and the wiring layers 30 are concentrated under the peripheral portion of the pad electrode 40. In this case, when a compressive force is applied to the central portion of the pad electrode 40, stress is concentrated on the interlayer insulation 20 between the wiring layers 30. Also, the area of contact between the wiring layers 30 and the interlayer insulation layer 20 is relatively small. As a result, the structure has a significant tendency to crack. The cracks are mainly created along vertical boundary surfaces where the layers of the interlayer insulation 20 and the wiring layers 30 contact each other. That is, the layers of the interlayer insulation 20 are vulnerable to cracking when the vertical boundary surfaces are aligned or are located a short distance from one another. If cracking occurs, the central portion of the pad electrode 40 may be delaminated from the interlayer insulation layer 20.

Figure 5:
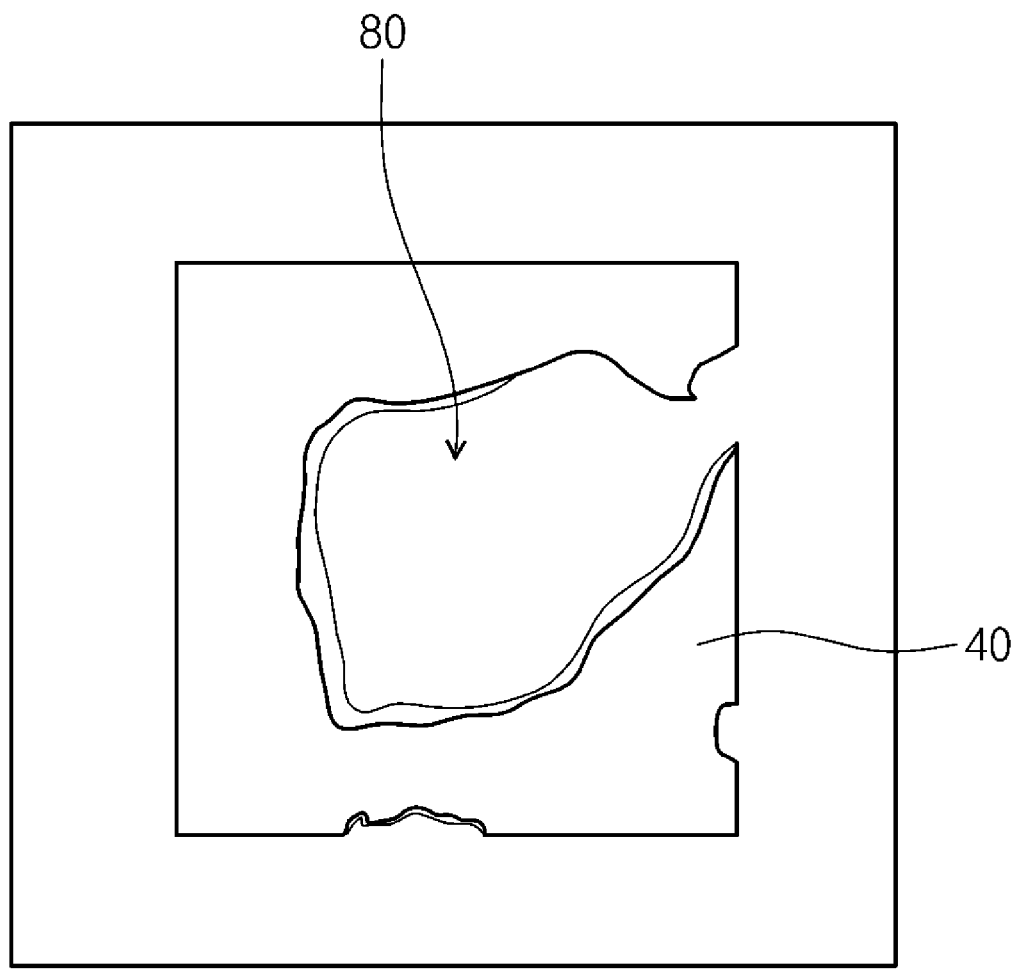
FIG. 5 is a plan view of a bonding pad according to the related art, showing a peel-off defect.

That is, the cracking may produce a peel-off defect 80 at a central portion of the pad electrode 40 as shown in FIG. 5. Referring to FIG. 5, when wire 70 electrically coupled to the pad electrode 40 is pulled by a given force, the cracking allows the central portion of the pad electrode 40 to peel off the interlay insulation layer 20 whereas the peripheral part of the pad electrode 40 remains intact due to the coupling of the peripheral part of the pad electrode 40 to the lower wiring layers 30 by the contact plugs. The pull on the wire 70 may occur when the structure is subjected to a post-manufacture package or ball pulling test (hereinafter, referred to as 'BPT').

On the other hand, referring to FIGS. 2 and 4A, in an embodiment of CUP structure according to the inventive concept described above, that portion of the interlayer insulation 20 located beneath the exposed part of the pad electrode 40 is generally wedge-shaped and more specifically, has the form of an inverted square pyramid or at least a section (frustum) of such a pyramid whose base is disposed adjacent the pad electrode 40, whose sides lie along the inner peripheral edges of the lower wiring layers 30 and whose vertex or top is located close to the substrate 10. As is clear from the drawings, this portion of the interlayer insulation 20 is delimited by planes each extending between the upper wiring layer 40 and the substrate 10 and each connecting a respective set of edges of the wiring layers 32, 34 and 36 on the same side of the openings 31, 33 and 35.

Accordingly, the vertical boundary surfaces between the layers of the interlayer insulation 20 and the wiring layers 30 are laterally offset from one another and are spaced relatively far apart from one another. Therefore, when the ball 60 and the wire 70 are bonded to the pad electrode 40, the resulting stress is transferred from the fourth interlayer insulation layer 28 to the third interlayer insulation layer 26 and that part of the third wiring layer 36 located under the third opening 35. In this way, the third wiring layer 36 alleviates the stress applied to the fourth interlayer insulation layer 28. The third interlayer insulation layer 26 transfers the stress to the second interlayer insulation layer 24 and that part of the second wiring layer 34 located under the second opening 33. In this way, the second wiring layer 34 alleviates the stress applied to the third interlayer insulation layer 26. The second interlayer insulation layer 24 transfers the stress to the first interlayer insulation layer 22 and that part of the first wiring layer located under the first opening 31. In this way, the first wiring layer 32 alleviates the stress applied to the second interlayer insulation layer 24.

Also, the tendency of the layers to delaminate decreases as the contact area between the layers increases. For example, the contact area between the first interlayer insulation layer 22 and the first wiring layer 32 is relatively large and thus, there is little likelihood that cracking or delaminating will occur between these layers.

Figure 6:
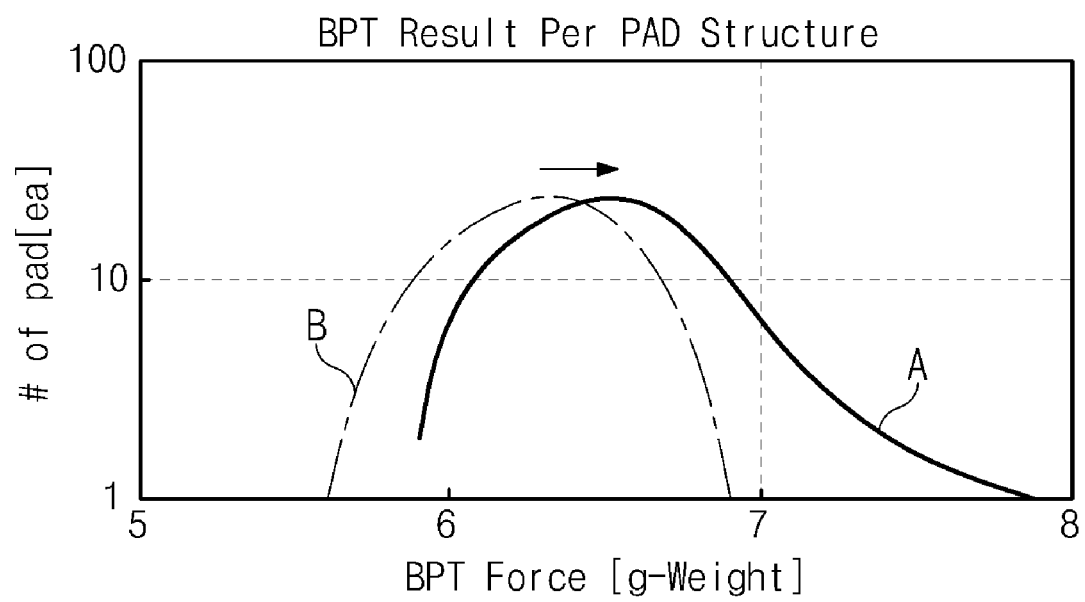
FIG. 6 is a graph of BPT results for bonding pads according to the inventive concept and the related art.

FIG. 6 is a graph of BPT results of bonding pads according to the inventive concept and the related art. The pulling force in g-weight or g·c$^{m/s^2}$ is plotted along the transverse axis of the graph, and a common logarithm value for the number of bonding pads 2 is plotted along the vertical axis. Also, line A represents test results of bonding pads embodied according to the inventive concept (i.e., according to the configuration represented in FIG. 4A) and line B represents test results of bonding pads embodied according to the related art (i.e., according to the configuration represented in FIG. 4B).

In FIG. 6, as can be seen from test results A, the peel-off defect 80 is produced in a bonding pad embodied according to the inventive concept mostly when a pulling force of approximately 6.6 g-weight (g·c$^{m/s^2}$) is applied thereto. On the other hand, test results B show that the peel-off defect 80 is produced in a bonding pad according to the related art mostly when a pulling force of approximately 6.4 g-weight (g·c$^{m/s^2}$) is applied thereto. That is, a bonding pad according to the inventive concept is more resistant to peel-off defects, by an average of approximately 0.2 g-weight (g·c$^{m/s^2}$), than a corresponding bonding pad according to the related art.

As described above, in a bonding pad 2 of a semiconductor device according to the inventive concept, the propensity of the interlayer insulation layer 20 to crack is allayed by the lower wiring layers 30 which each extend from an edge of the bonding pad towards the center thereof and whose areas sequentially increase in the depth-wise direction of the interlayer insulation layer 20. Thus, A peel-off defect of the upper wiring layer 40 is prevented from occurring.

An embodiment of a method of manufacturing a CUP structure of a semiconductor device according to the inventive concept will now be described with reference to FIGS. 7A to 7N.

Figure 7A:
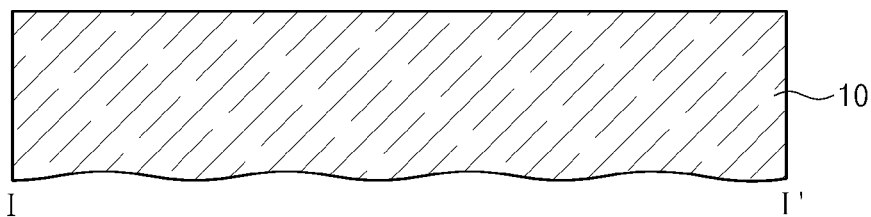
FIGS. 7A to 7N are each a cross-sectional view of a substrate and together illustrate an embodiment of a method of manufacturing a CUP structure of a semiconductor device according to the inventive concept.

Referring to FIG. 7A, a substrate 10 may be provided. The substrate 10 may be a single crystalline bare silicon substrate.

Figure 7B:
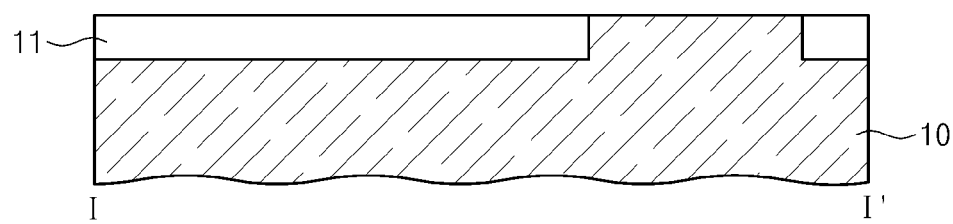

Referring to FIG. 7B, a device isolation layer 11 is formed on the substrate 10. The device isolation layer 11 may define an active region of the substrate 10.

Figure 7C:
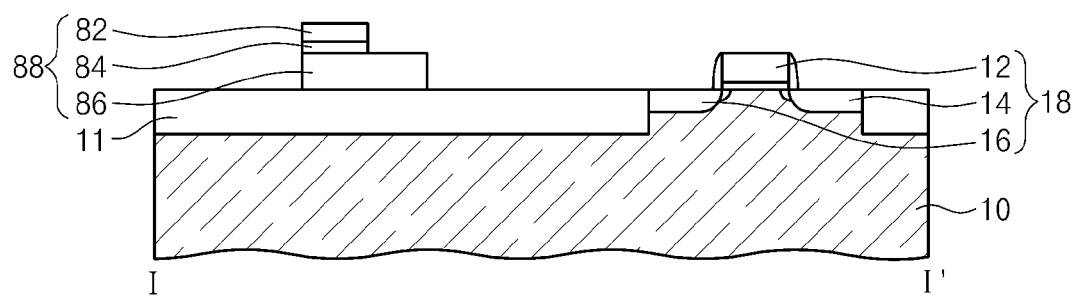

Referring to FIG. 7C, a circuit pattern(s) constituting an electronic component(s) is/are formed on the substrate 10. Each component is formed on the active region or on the device isolation layer 11. For example, a MOS transistor 18 including a source 14, drain 16 and a gate electrode 12 is formed on the active region. A capacitor 88 including a lower electrode 86, a dielectric layer 84, and an upper electrode 82 may be formed on the device isolation layer 11.

Figure 7D:
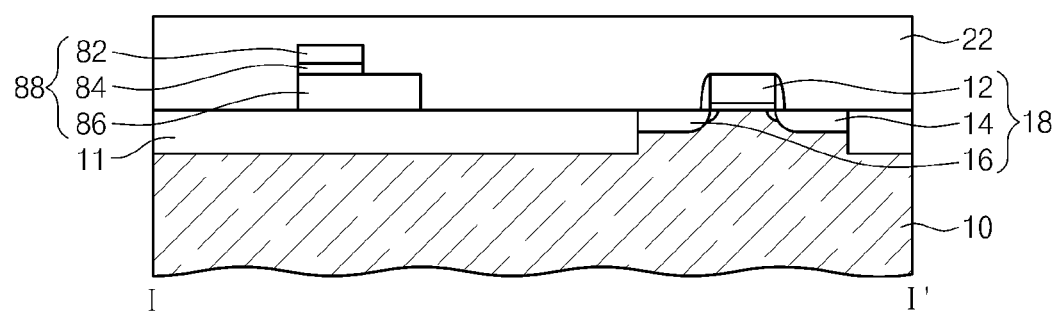

Referring to FIG. 7D, a first interlayer insulation layer 22 is formed on the component(s) 18, 88, the device isolation layer 11, and the substrate 10. The first interlayer insulation layer 22 may comprise a silicon oxide layer. Such a silicon oxide layer can be formed by a rapid thermal process or by a chemical vapor deposition.

Figure 7E:
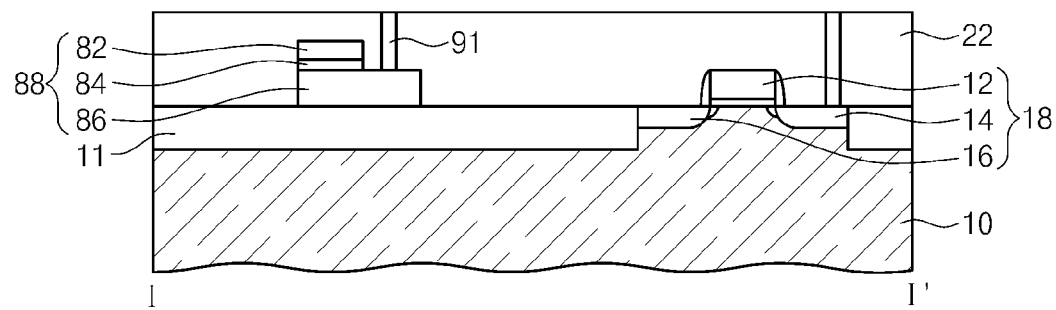

Referring to FIG. 7E, sub contact holes are formed in the first interlayer insulation layer 22 to expose the electronic component(s) 18, 88, and then sub contact plugs 91 are formed in the sub contact holes. The sub contact plugs 91 may comprise a layer of conductive metal such as tungsten. The sub contact plugs 91 may be formed by over-filling the sub contact holes with metal and then planarizing the resulting layer of metal to form sub contact plugs 91 whose upper surfaces are flush with that of the first interlayer insulation layer 22.

Figure 7F:
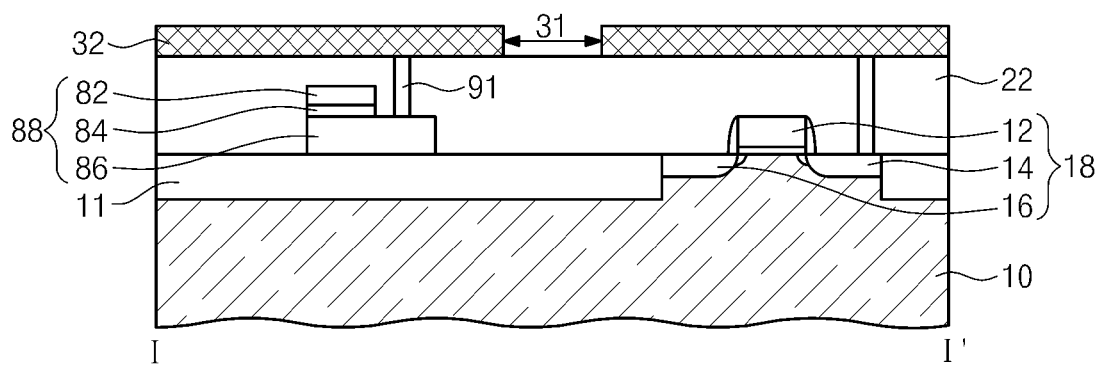

Referring to FIG. 7F, a first wiring layer 32 having a first opening 31 therethrough is formed on the first interlayer insulation layer 22. The first wiring layer 32 covers the sub contact plugs 91. The first wiring layer 32 may be a layer of aluminum formed by a physical vapor deposition process such as sputtering, or by a chemical vapor deposition process. The first wiring layer 32 may further comprise titanium or titanium nitride as a barrier to prevent oxidation at the boundary between the first interlayer insulation layer 22 and the first wiring layer 32. In any case, the first wiring layer 32 is electrically connected to the component(s) 18, 88 or the substrate 10 through the sub contact plug 91.

Figure 7G:
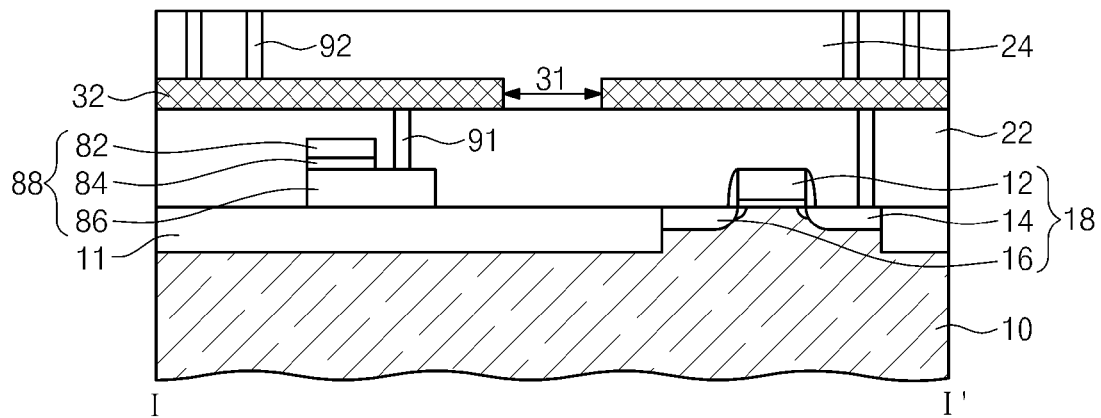

Referring to FIG. 7G, second interlayer insulation layer 24 is formed on, i.e., is stacked on, the first lower wiring layer 32 and thereby buries the first opening 31. The second interlayer insulation layer 24 may comprise silicon oxide similarly to the first interlayer insulation layer 22. In addition, a contact hole is formed in the second interlayer insulation layer 24 so as to expose the first lower wiring layer 32, a layer of conductive material is then formed on the second interlayer insulation layer 24 to such a thickness as to fill the contact hole, and the resultant structure is planarized to form first contact plug 92 in the contact hole. Accordingly, the first contact plug 92 is (electrically conductively) connected to the first lower wiring layer 32.

Figure 7H:
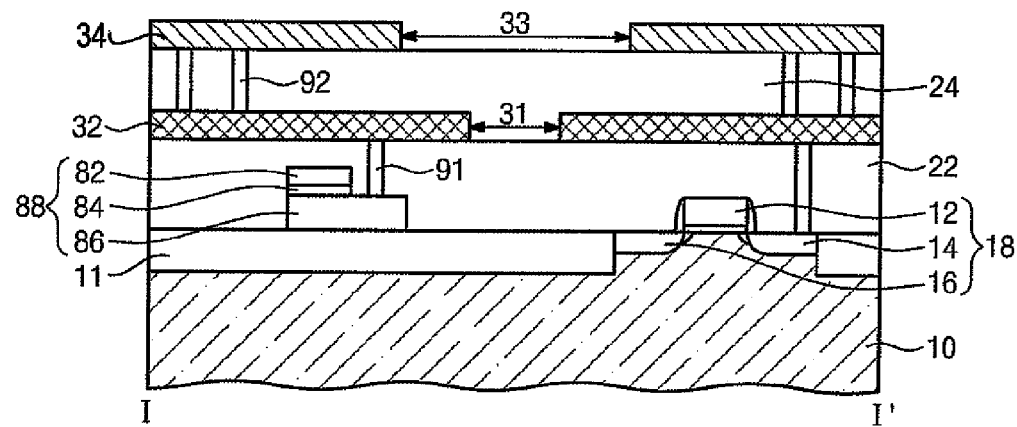

As illustrated in FIG. 7H, a second lower wiring layer 34 having a second opening 33 larger than the first opening 31 is formed on the second interlayer insulation layer 24. Thus, the area of the second interlayer insulation layer 24 exposed by the second opening 33 is larger than the area of the first interlayer insulation layer 22 exposed by the opening 31 of the first lower wiring layer 32. The second lower wiring layer 34 may comprise aluminum or tungsten, and titanium or titanium nitride as a barrier at its boundary with the second interlayer insulation layer 24 to prevent oxidation.

Figure 7I:
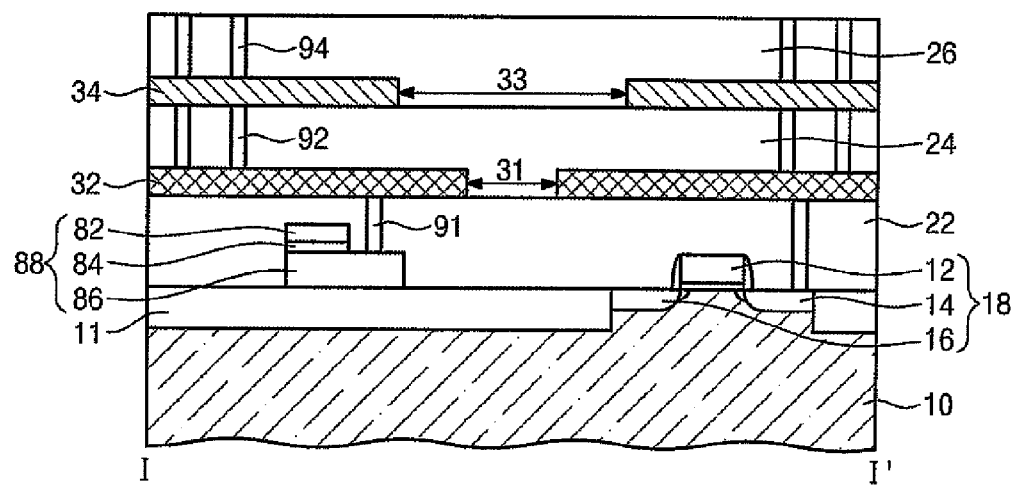

As shown in FIG. 7I, a third interlayer insulation layer 26 is formed on over the entire surface of the substrate 10 on the second lower wiring layer 34 so as to bury the second opening 33. The third interlayer insulation layer 26 comprises silicon oxide and has a contact plug 94 extending therethrough into contact with the second wiring layer 34. More specifically, an insulation layer of a given thickness is formed on the second lower wiring layer 34, a portion of the insulation layer is removed to form a contact hole that exposes the second lower wiring layer 34, and a conductive (metal) layer is formed on the insulation layer so as to fill the contact hole. Then, the resultant structure is planarized.

Figure 7J:
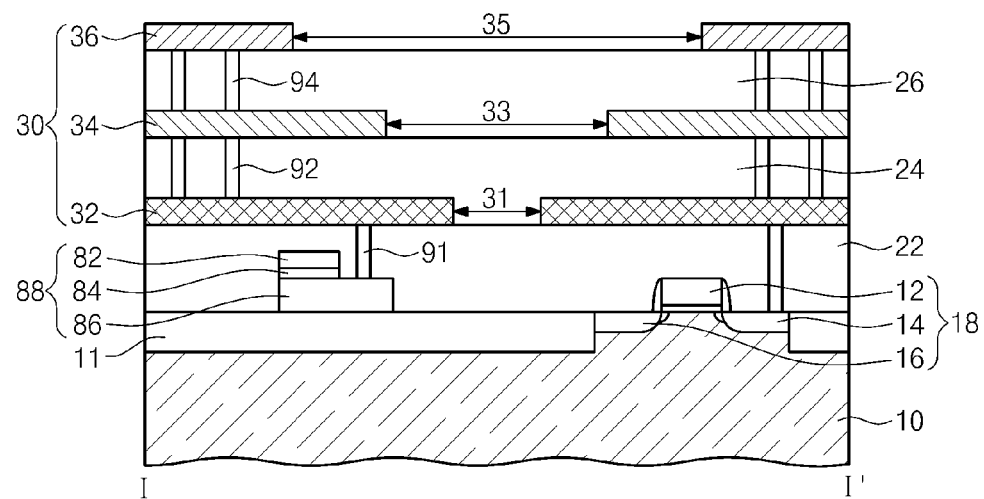

As illustrated in FIG. 7J, a third lower wiring layer 36 having a third opening 35 larger than the second opening part 33 is formed on the third interlayer insulation layer 26. The area of the second interlayer insulation layer 26 exposed by the third opening 35 is larger than the area of the second interlayer insulation layer 24 exposed by the second opening 33. The second third wiring layer 34 may comprise aluminum or tungsten, and titanium or titanium nitride as a barrier at its boundary with the third interlayer insulation layer 26 to prevent oxidation.

Figure 7K:
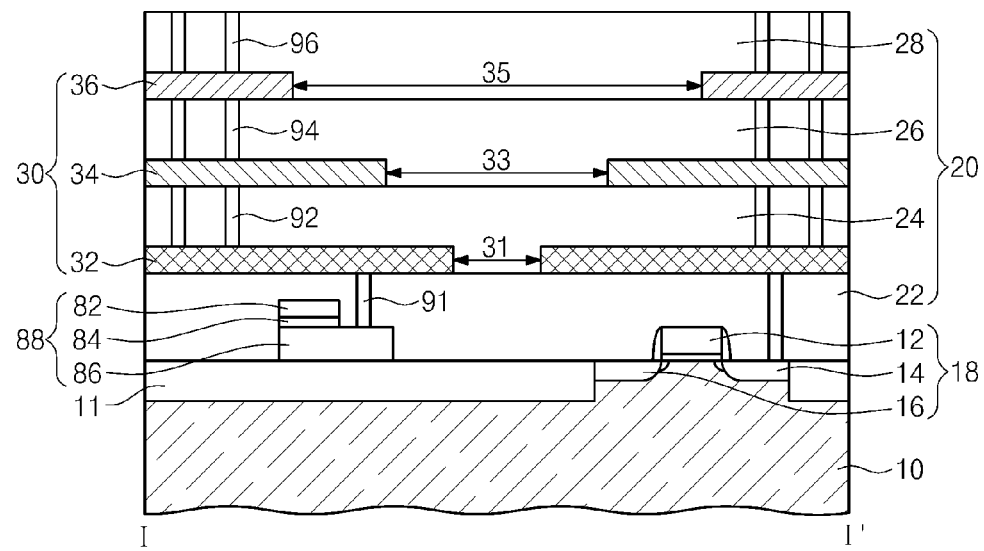

As illustrated in FIG. 7K, fourth interlayer insulation layer 28 is formed on the third lower wiring layer 36 so as to bury the third opening 35. Similarly to the first to third interlayer insulation layers 22 to 26, the fourth interlayer insulation layer 28 may comprise silicon oxide. The fourth interlayer insulation layer 28 may also be formed in a manner similar to the first to third interlayer insulation layers 22 to 26. That is, insulating material is deposited on the third lower wiring layer 36, a contact hole exposing the third lower wiring layer 36 is formed, a layer of conductive material is formed on the insulating material to fill the contact hole, and the resultant structure is planarized to form the third contact plug 96 in the contact hole. The third contact plug 96 is thus electrically conductively connected to the third lower wiring layer 36.

Furthermore, the first, second and third openings 31, 33 and 35 are formed so as to be disposed vertically one above the other, with the second opening spanning the entire region over which the first opening 31 extends and the third opening 35 spanning the entire region over which the second opening 33 extends. In this embodiment, the openings 31, 33 and 35 are formed with their geometrical centers aligned along the same vertical axis. Thus, a stabilized wedge-shaped portion of the second, third and fourth interlayer insulation layers 24, 26 and 28 is formed within the openings 31, 33 and 35. Specifically, the wedge-shaped portion is delimited by planes that respectively connect adjacent inner peripheral edges of the wiring layers 32, 34 and 36 which delimit the openings 31, 33 and 35. Accordingly, the wedge-shaped portion is a frustum of an inverted regular pyramid.

Figure 7L:
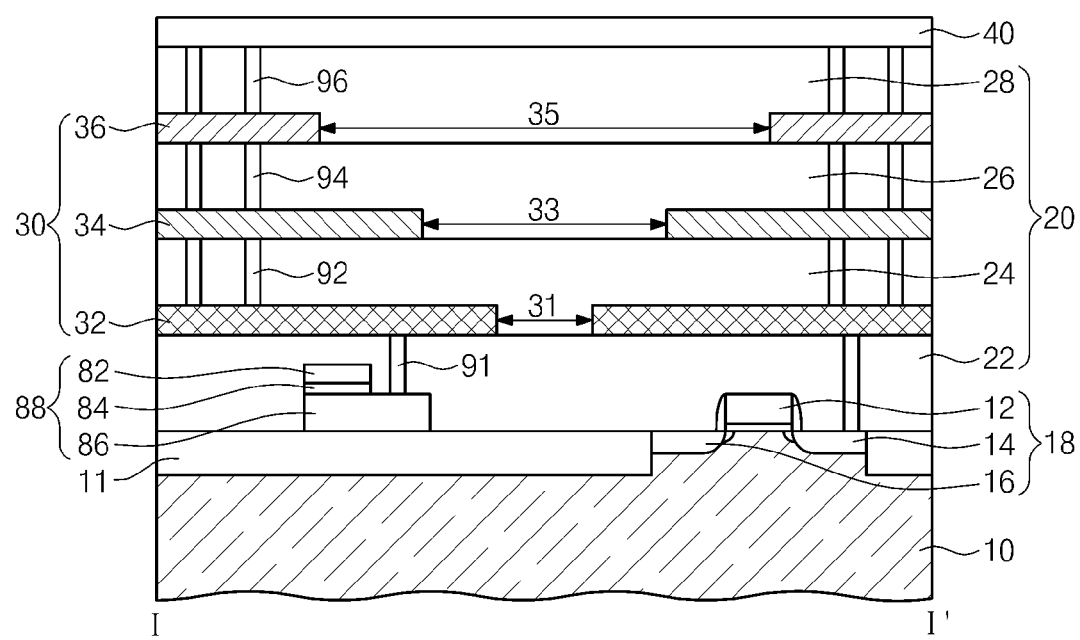

As shown in FIG. 7L, pad electrode 40 is formed on the fourth interlayer insulation layer 28 and spans the region over which the third opening 35 extends. The pad electrode 40 is a square or quadrangular layer of material whose outer periphery is aligned with that of the third lower wiring layer 36 (and in general, with that of the lower wiring layers 30). Also, the pad electrode 40 is electrically conductively connected to the contact plug 96 at an outer peripheral portion of the pad electrode 40.

Figure 7M:
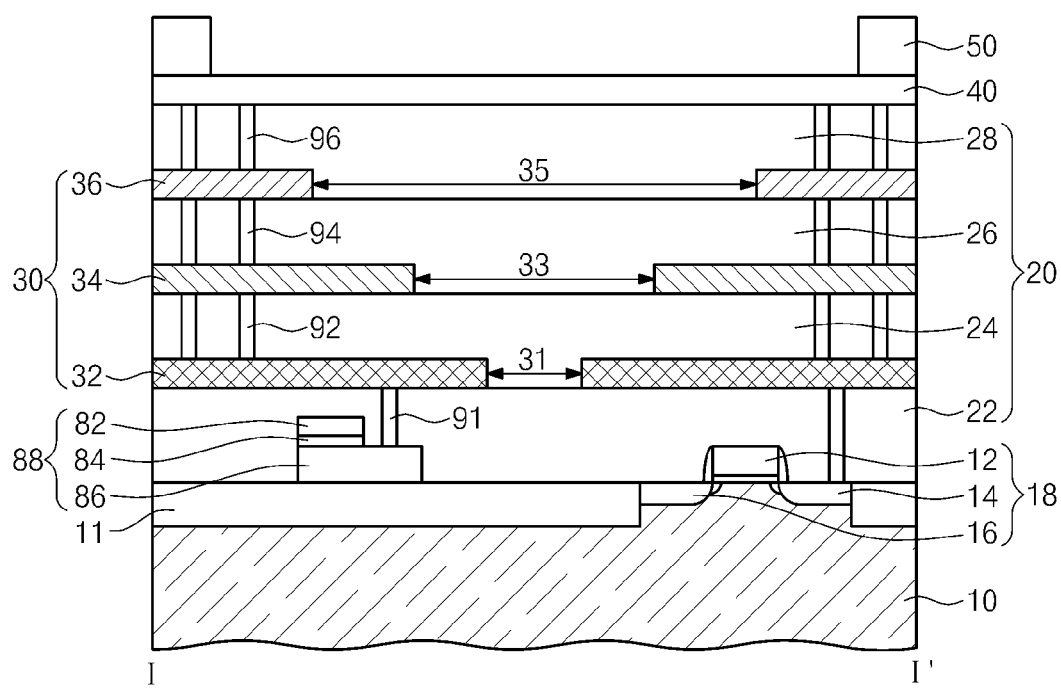

As shown in FIG. 7M, a passivation layer 50 is formed on the upper wiring layer 40. The passivation layer 50 selectively exposes the pad electrode 40, e.g., exposes a central part of the pad electrode 40 while covering an outer peripheral portion of the pad electrode 40. The passivation layer 50 serves to prevent the pad electrode 40 from being contaminated and may serve to alleviate height differences at the outer periphery of the pad electrode.

Figure 7N:
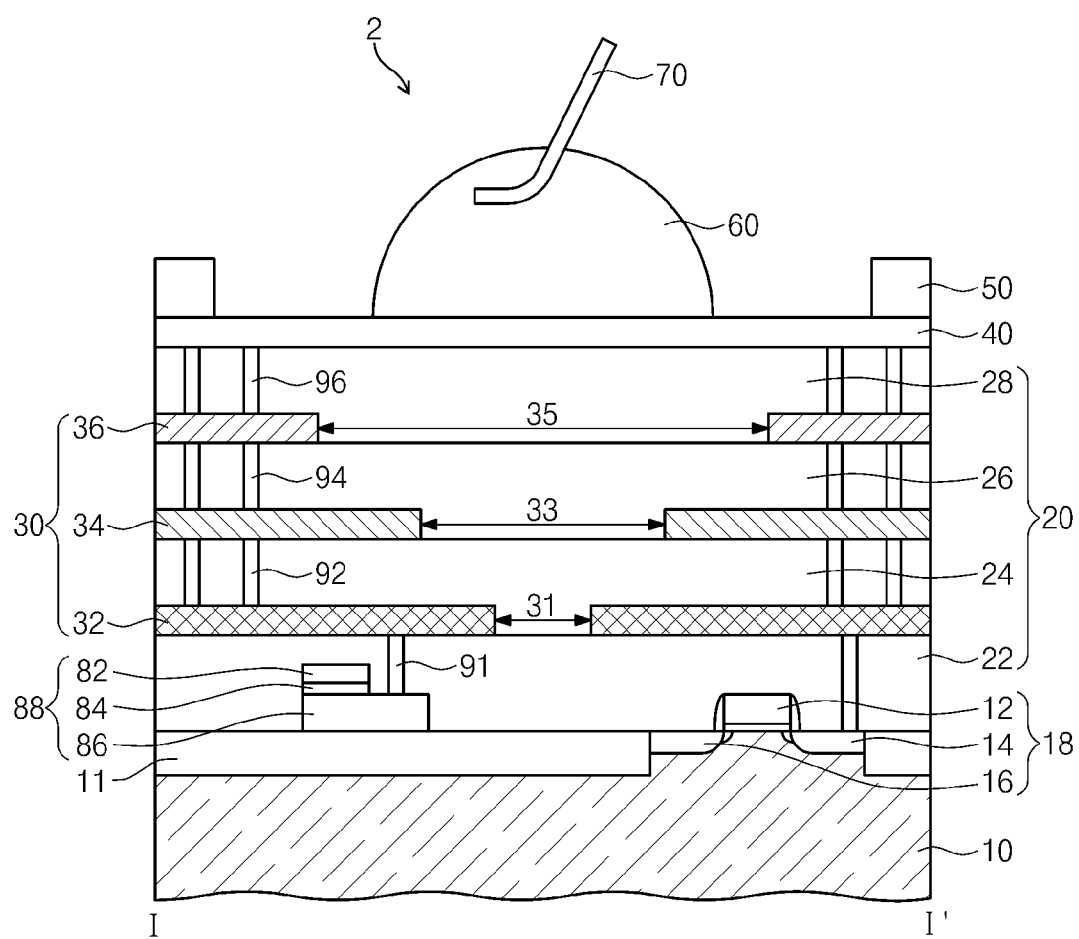

As shown in FIG. 7N, a wire 70 is bonded to the pad electrode 40. More specifically, the wire 70 is pressed together with a ball 60 against that part of the pad electrode 40 exposed by the passivation layer 50, or the ball 60 is set on the pad electrode and the wire is pressed against the ball 60. In either case, as a result of this compressive force, the wire 70 is joined to the pad electrode 40 through the intermediary of the ball 60.

According to one aspect of the inventive concept as described above, the interlayer insulation layer 20 serves as a support layer which receives the downward compressive force applied to the pad electrode 40 during the bonding of the wire 70 to the pad electrode 40, and is configured to alleviate the stress caused by the downward compressive force. Thus, a high yield of bonding pads can be realized.

According to another aspect of the inventive concept, a circuit pattern(s) comprising an electronic component(s) serving as an input/output device, for example, is disposed under the pad electrode 40. Therefore, the layout or size of the footprint of the structure is minimal.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. Circuit under pad structure, comprising:
a substrate, and a device isolation layer of electrically insulative material in the substrate and delimiting an active region of the substrate;
a bonding pad comprising interlayer insulation layers disposed on the substrate,
a pad electrode of electrically conductive material disposed on the interlayer insulation layers, and
lower layers of wiring alternately disposed with the interlayer insulation layers between the pad electrode and the substrate, the widths of the lower layers of wiring sequentially increasing in a downward direction from the pad electrode towards the substrate; and
at least one electronic circuit disposed beneath a lowermost one of the lower layers of wiring, and
wherein the pad electrode spans each said at least one electronic circuit, and the at least one electric circuit comprises a capacitor on the device isolation layer.

2. Circuit under pad structure, comprising:
a substrate:
a bonding pad comprising interlayer insulation layers disposed on the substrate,
a pad electrode of electrically conductive material disposed on the interlayer insulation layers, and
lower layers of wiring alternately disposed with the interlayer insulation layers between the pad electrode and the substrate, the widths of the lower layers of wiring sequentially increasing in a downward direction from the pad electrode towards the substrate;
at least one electronic circuit disposed beneath a lowermost one of the lower layers of wiring, and wherein the pad electrode spans each said at least one electronic circuit; and
a rounded body of electrically conductive material disposed on a central part of the bonding pad.

3. The structure of claim 1, wherein each of the lower layers of wiring has an opening therethrough, whereby each of the lower layers of wiring has edges that define the opening, and the areas of the openings sequentially decrease in the downward direction.

4. The structure of claim 3, further comprising contact plugs connecting the layers of wiring to each said at least one circuit.

5. The structure of claim 2, wherein the at least one electric circuit comprises an electrostatic discharge (ESD) circuit.

6. The structure of claim 2, wherein each said at least one electric circuit comprises one of a MOS transistor, a capacitor, a resistor and a diode.

7. The structure of claim 6, further comprising a device isolation layer of electrically insulative material in the substrate and delimiting an active region of the substrate.

8. The structure of claim 7, wherein the at least one electric circuit comprises a transistor at the active region.

9. The structure of claim 7, wherein the at least one electric circuit comprises a capacitor on the device isolation layer.

10. The structure of claim 2, wherein each of the lower layers of wiring has an opening therethrough, whereby each of the lower layers of wiring has edges that define the opening, and the areas of the openings sequentially decrease in the downward direction.

11. The structure of claim 10, further comprising contact plugs connecting the layers of wiring to each said at least one circuit.

12. A semiconductor device, comprising:
a substrate;
an array of bonding pads on the substrate, wherein the array of bonding pads comprises interlayer insulation on the substrate,
bonding pads of electrically conductive material disposed on the interlayer insulation, and
lower layers of wiring embedded within the interlayer insulation between the pad electrodes and the substrate, and
wherein each of the bonding pads comprises a respective one of the pad electrodes, the lower layers of wiring have openings therethrough, each of the bonding pads includes a plurality of vertically aligned ones of the openings, and the size of the openings in the lower layers of wiring of each of the bonding pads sequentially decreases in a downward direction from the pad electrode towards the substrate;

electronic components disposed beneath a lowermost one of the lower layers of wiring, and wherein the electrode pad of each of the bonding pads spans at least one of the electronic components; and electrical leads each of which is bonded to the pad electrode of a respective one of the bonding pads at a location disposed directly above the opening in the uppermost one of the lower layers of wiring of the bonding pad.

13. The semiconductor device of claim 12, wherein the interlayer insulation is of silicon oxide.

14. The semiconductor device of claim 12, wherein each of the lower layers of wiring comprises a ring of conductive material, the openings pass through the centers of the rings of conductive material, respectively, of the lower layers of wiring and are filled completely by the interlayer insulation, and each of the bonding pads comprises a plurality of vertically juxtaposed ones of the rings of conductive material.

15. The semiconductor device of claim 14, further comprising bodies of electrically conductive material each disposed on a central part of a respective one of the bonding pads, and wherein the bodies of electrically conductive material secure the electrical leads to respective ones of the pad electrodes.

16. The semiconductor device of claim 15, wherein the bodies of electrically conductive material are rounded and the electrical leads are each a wire.

17. The semiconductor device of claim 12, further comprising bodies of electrically conductive material each disposed on a central part of a respective one of the bonding pads, and wherein the bodies of electrically conductive material secure the electrical leads to respective ones of the pad electrodes.

18. The semiconductor device of claim 17, wherein the bodies of electrically conductive material are rounded and the electrical leads are each a wire.

19. The semiconductor device of claim 12, wherein the opening in the lowermost one of the lower layers of wiring is disposed directly above a region of the device that is devoid of electronic components.

* * * * *